United States Patent
Niese et al.

(10) Patent No.: US 7,270,240 B2
(45) Date of Patent: Sep. 18, 2007

(54) DEVICE FOR ACCOMODATING SUBSTRATES

(75) Inventors: Matthias Niese, Neumarkt (DE); Jörg Franzke, Neumarkt (DE); Jürgen Schweckendiek, Berlin (DE)

(73) Assignee: RENA Sondermaschinen GmbH, Gütenbach (DE)

( * ) Notice: Subject to any disclaimer, the term of this patent is extended or adjusted under 35 U.S.C. 154(b) by 526 days.

(21) Appl. No.: 10/493,789

(22) PCT Filed: Mar. 31, 2003

(86) PCT No.: PCT/EP03/03312

§ 371 (c)(1),
(2), (4) Date: Apr. 27, 2004

(87) PCT Pub. No.: WO03/085704

PCT Pub. Date: Oct. 16, 2003

(65) Prior Publication Data

US 2004/0262245 A1 Dec. 30, 2004

(30) Foreign Application Priority Data

Apr. 5, 2002 (DE) ................................ 102 15 283

(51) Int. Cl.
*A47G 19/08* (2006.01)
(52) U.S. Cl. .................................. 211/41.18
(58) Field of Classification Search ............. 211/41.18, 211/41.1; 206/454, 832; 118/500
See application file for complete search history.

(56) References Cited

U.S. PATENT DOCUMENTS

| 4,872,554 | A | * | 10/1989 | Quernemoen | ................ 206/454 |
|---|---|---|---|---|---|
| 5,534,074 | A | * | 7/1996 | Koons | ......................... 118/728 |
| D381,344 | S | * | 7/1997 | Kosaku | ...................... D15/140 |
| 5,788,304 | A | * | 8/1998 | Korn et al. | .................. 294/159 |
| 5,944,038 | A |   | 8/1999 | Horton et al. | |
| 6,086,127 | A | * | 7/2000 | Korn et al. | .................. 294/159 |
| 6,237,979 | B1 | * | 5/2001 | Korn et al. | .................. 294/159 |
| 6,340,090 | B1 | * | 1/2002 | Jahani et al. | ............... 211/41.1 |
| 6,571,964 | B2 | * | 6/2003 | Jacobson et al. | ......... 211/41.12 |

FOREIGN PATENT DOCUMENTS

| DE | 24 22 527 A | 11/1975 |
|---|---|---|
| DE | 43 00 205 A1 | 7/1994 |
| DE | 197 53 471 A1 | 7/1998 |

OTHER PUBLICATIONS

WO 96/05611 A, Support for Substrates, Publication Date: Feb. 22, 1996.

* cited by examiner

*Primary Examiner*—Sarah Purol
(74) *Attorney, Agent, or Firm*—Rankin, Hill, Porter & Clark LLP

(57) ABSTRACT

The present invention is directed to a device for retaining substrates (S), such as wafers or silicon substrates for the production of photovoltaic elements. The device includes opposing walls (1) that are interconnected by at least two rod-like carrier elements (2, 3) that are provided with a retaining means (5) for retaining the substrates (S) in a vertical position oriented parallel to the walls (1). At least one rod-like counter carrier element (4) is also provided and interconnects the two walls (1). The counter carrier element (4) is positioned in relation to the carrier elements (2, 3) so that vertical movement of the substrates (S) relative to the walls (1) is limited and loading or unloading of the substrates (S) is possible at a slant in relation to the vertical direction (V).

26 Claims, 3 Drawing Sheets

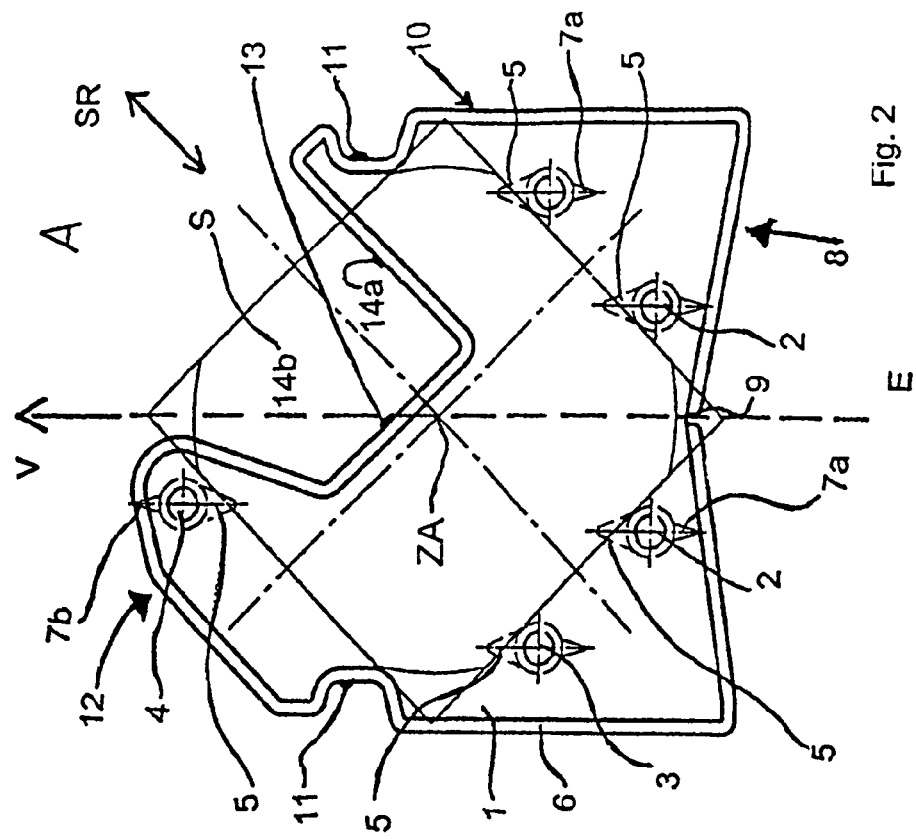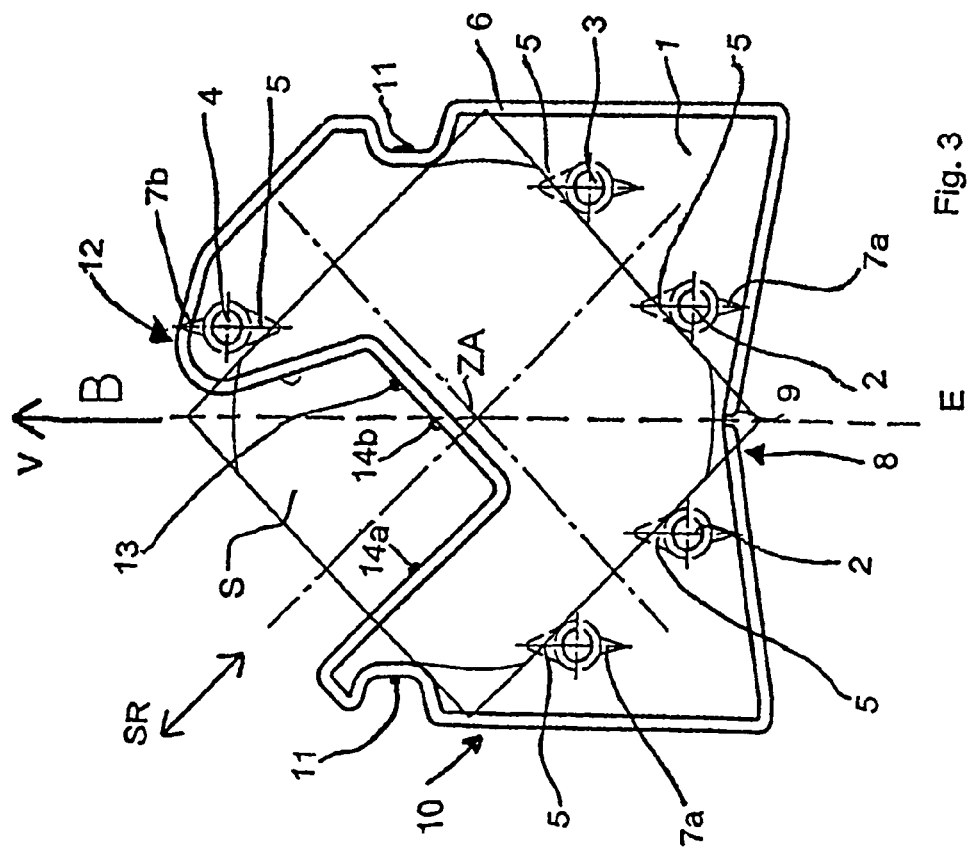

DEVICE FOR ACCOMODATING SUBSTRATES

BACKGROUND OF THE INVENTION

The invention relates to a device for retaining substrates as defined by the preamble of claim 1.

Such a device is used for the horizontal or vertical setting of a plurality of substrates such as wafers or substrates for the production of photovoltaic elements. The device with the substrates inside is dipped in processing baths to etch, clean or dry and then lifted out again.

Based on the prior art such devices which are also called trays or carriers usually consist of four circumferential walls. On the inside of the vis-à-vis longitudinal walls there are vertically running slits in which the substrates are inserted on the edges. The longitudinal walls can be bent inward in the area of their lower edges so that the substrates do not fall out at the bottom. Such a device is known, for instance, from U.S. Pat. No. 5,299,901. Similar devices are described in EP 0 385 536, U.S. Pat. No. 4,963,069 as well as U.S. Pat. No. 4,722,752.

A device of this type is known, for example, from DE 42 23 326 B1 as well as DE 44 28 169 C2. With this the substrates are supported on several rod-like carrier elements which connect two adjacent vis-à-vis walls with each other. These devices do not have longitudinal walls with slits.

In practical use it sometimes occurs that the hydrogen created in a caustic bath during the etching process sticks in the form of bubbles to the surface of the substrates. Because of this the substrates can be lifted out of the device and float in the caustic bath. Removal of such floating substrates requires additional effort. Undesired contaminations of the processing fluids may occur during this.

From DE 43 00 205 A1 a cassette for retaining the substrates is known. The cassette has an insert in which the substrates are supported on two carrier elements. A counter carrier element is provided to hold the substrates in place. The suggested cassette prevents the substrates from floating up in the caustic bath. The loading or unloading of the substrates is time-consuming, however. First the insert must be lifted out of the cassette and then the counter carrier element must be removed.

The object of the invention is to eliminate the drawbacks of the prior art. In particular a device is to be specified with which substrates can be prevented from floating up and which can be handled as simply as possible.

SUMMARY OF THE INVENTION

The object is solved by the features of claim 1. Useful embodiments result from the features of claims 2 to 25.

According to the invention it is provided that at least one of the counter carrier elements connecting the two walls is provided which is positioned in relation to the carrier elements so that a vertical movement of the substrates relative to the walls is restricted and loading or unloading the substrates at a slant to the vertical direction is made possible.

In this simple way it is achieved that the substrates in the processing bath are not lifted from the device. A vertical movement of the substrates in the direction of the surface of the fluid is limited by the counter carrier element. This means that lifting the substrates from the carrier elements is only possible to the extent that they are still held securely in the retaining means and they cannot escape from the device. The device is usually constructed so that the substrates in the submerged state can lift up a few millimeters from the carrier elements. Also with a movement of the substrates in the processing bath directed at a slant upwards towards the surface of the fluid, these cannot escape from the device since, in this case, they would bump into the wall of the processing basin. In contrast, the substrates can be loaded or unloaded at a slant with the device lifted out of the processing bath. In particularly it is not necessary to remove the counter carrier element from the device before loading or unloading.

The term "rod-like carrier element" is understood in general to mean a long, stretched-out carrier element. The cross-section of such a carrier element can assume a round, rectangular, polygonal or other form. Of primary importance to the embodiment of the carrier elements is that, when the device is removed from the processing bath, the thereto adhering processing fluid flows away completely and unhindered.

The counter carrier element can be secured on the walls, preferably detachably. With a detachable mounting of the counter carrier element, the counter carrier element can be removed after lifting the device from the processing bath and then the substrates can also be loaded or unloaded in vertical direction. A detachable mounting can be implemented, for example, with a suitable catch device which is formed so that the counter carrier element can be detached by a robot and then can be attached again. The suggested device is particularly universal.

According to an embodiment at least one of the carrier elements is equipped with slit-like recesses or teeth as the retaining means. The carrier element can, for example, be a cylindrical rod which has cuts adjacent to each other as the retaining means. However it can also be that saw-tooth-like teeth are provided next to each other on the rod.

Suitably the teeth are placed on the carrier element so that a tooth base of the teeth is located on an upper apex line of the carrier element. This ensures that the processing fluid completely drains off when a carrier element equipped with such teeth is lifted up.

In a similar way the counter carrier element can also have slit-type recesses or teeth as retaining means pointing in the direction of the carrier element. Usefully, the teeth are arranged on the counter carrier element so that a tooth base of the teeth is located on the lower apex line of the counter carrier element. This measure also ensures reliable complete draining of the processing fluid when the counter carrier element is lifted out of the processing bath.

According to a further particularly advantageous embodiment the counter carrier element is positioned or formed in relation to the carrier element so that the substrates are always held by the retaining means during a movement in the vertical direction. In this case, not only an undesired lifting of the substrates out of the device is prevented in the processing fluid but it is also ensured that the substrates are spaced parallel to each other in the device. A vertical movement of the substrates in a limited pre-specified amount within the holding elements also permits an exchange of fluid during the etching and thus an etching removal in the area of the bearing points of the substrates and thus therefore a full-surface etching of the substrates. Besides this, a slight lifting of the substrates in the vertical direction allows complete drying of the substrates. Using a suitable device, the substrates can be slowly lifted out of the processing bath. During the penetration of the substrates through the surface of the processing fluid, these can be briefly lifted by the carrier elements and, after penetration of the carrier elements through the processing fluid, placed again on these.

Suitably the carrier element has a draining ridge which primarily runs vertically downwards. In a similar way the counter carrier element can have an additional draining ridge which primarily runs vertically upwards. A width of the draining ridge and/or the additional draining ridge can increase towards the middle of the carrier element or the counter carrier element. The provision of such a draining ridge and additional draining ridge helps so that, when the carrier element or the counter carrier element is lifted out of the processing fluid, fluid runs completely off the carrier element or counter carrier element. It is ensured that the carrier element or the counter carrier element can be lifted, completely dry, out of the processing fluid.

The edges of the walls can be slanted. Furthermore it is useful that the lower edges of the walls on both sides slant downwards from a centric U-shaped first recess. The U-shaped first recess serves as a centering mechanism for use of the device in a corresponding holding device in the movement basin. The suggested formation of the edges as well as the lower edges serves to help the processing fluid to completely run off from the walls when the device is lifted out.

According to a further embodiment the side edges of the walls have second recesses in an upper section in vis-à-vis arrangement for engagement of a gripping device. Furthermore an upper edge of the walls can have a third recess for use of a loading or unloading device for substrates. Suitably the third recess is restricted by at least two recess edges running at a slant to the side edges.

According to a further embodiment it is provided that a primary section of the side edges of the walls runs vertically. The vertical direction of the side edges corresponds to the vertical direction of movement of the device in the movement bath. Due to the vertical arrangement of the side edges it is ensured that the processing fluid adhering thereto can run off without any problems when the device is lifted out of the processing fluid.

According to a further embodiment the carrier element and/or the counter carrier element are made of a stiffening structure preferably coated with a first plastic. The stiffening structure can be made of metal, glass, ceramic or a second plastic preferably reinforced with fibers. The stiffening structure can, for instance, be made of a silicon carbide ceramic or of silica glass. The walls can also be made of the first plastic. This plastic is preferably a plastic which is resistant to acids and bases and which can be selected from the following group: PFA (perfluoroalkoxy polymer), PTFE (polyvinyl-diene-difluoride), PVDF (polytetrafluor ethylene), PP (polypropylene).

The first plastic can also be reinforced with fibers. Particularly suitable fibers are fibers made of carbon or glass.

According to a special embodiment it is provided that four carrier elements connect the walls. A parallel arrangement is usually used for the carrier elements. Their retaining means point in the approximate direction of an imaginary central axis of the device running parallel to the carrier elements. Two lower carrier elements can be installed in the vicinity of a lower edge of the walls and two upper carrier elements can be installed in the vicinity of a lower section of the side edges of the walls.

The counter carrier element can be installed in the vicinity of an upper edge of the side walls. Suitably the counter carrier element is positioned staggered in reference to a symmetry plane which is related to the arrangement or the formation of the carrier element/carrier elements and runs parallel to this/these. This special arrangement prevents a vertical movement of the substrates in the processing bath. At the same time a slanted loading or unloading of the substrates outside the processing bath is ensured. At least one counter carrier element can be permanently connected with the walls. However it can also be connected to the walls with, for example, a screw, clamp or catch connection which can be detached.

BRIEF DESCRIPTION OF THE DRAWINGS

Examples will now be used to describe the invention in more detail. The figures are listed below.

DETAILED DESCRIPTION OF THE PREFERRED EMBODIMENTS

Figure 1:
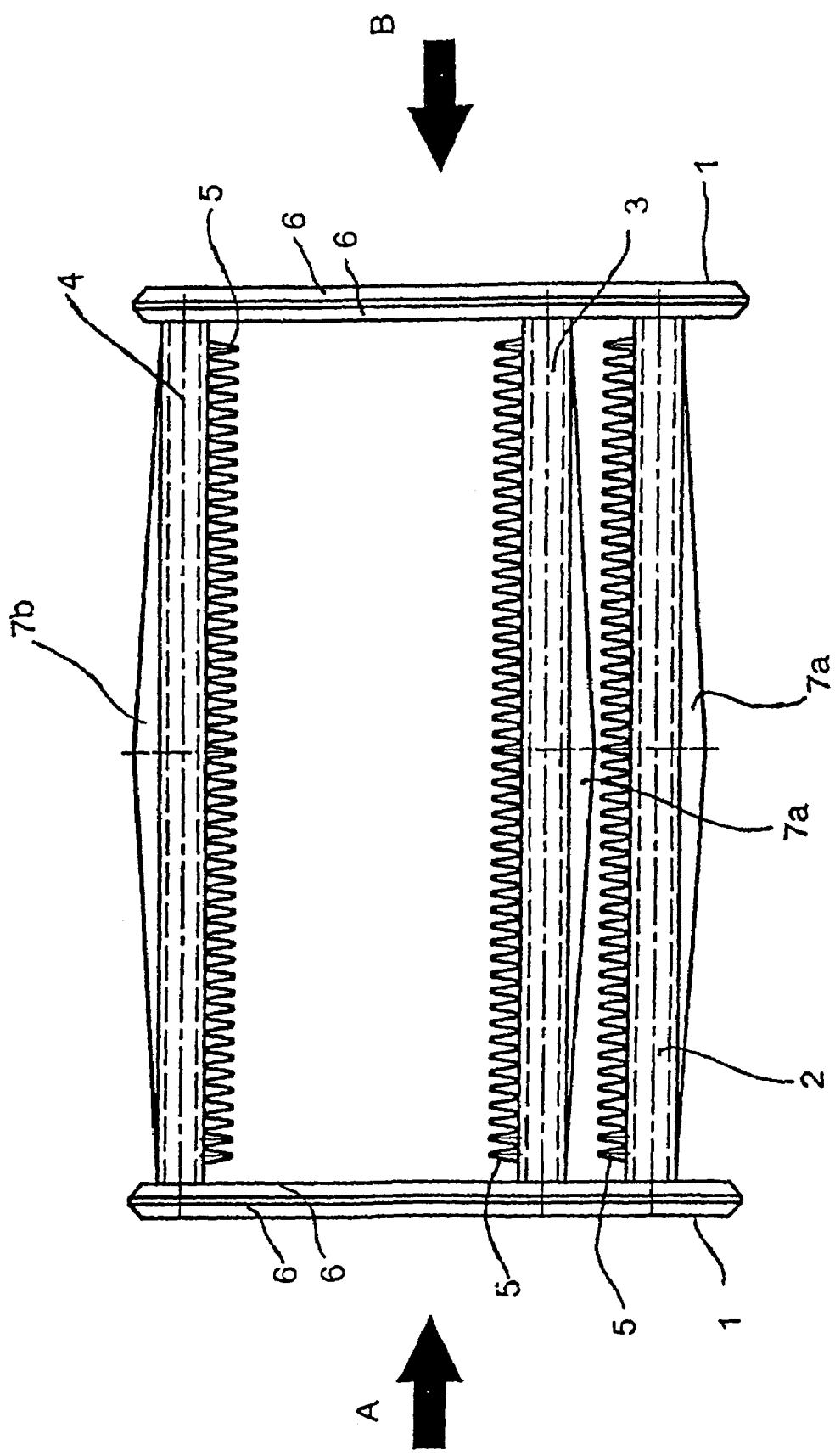
FIG. 1 A view of the longitudinal side of a device,
FIG. 2 The view A in accordance with FIG. 1,
FIG. 3 The view B in accordance with FIG. 1 and
FIG. 4 A schematic, cross section view of a carrier element or a counter carrier element.

The figures show a device for retaining substrates and similar in various views. Two walls 1 are undetachably connected with two lower carrier elements 2, two upper carrier elements 3 as well as one counter carrier element 4. The lower 2 and/or upper carrier elements 3 are symmetrically positioned in relation to a symmetry plane E. The counter carrier element 4 is positioned staggered to symmetry plane E. It is also connected undetachably here with the walls 1. Naturally it is also possible that the counter carrier element 4 is detachably connected with the walls 1. For this the counter carrier element 4 can, for example, be connected with conventional catch connections to the walls 1.

As is particularly illustrated in FIGS. 2 and 3, the walls 1 are formed mirror-inverted. A substrate retained in the device is designated with S. The substrate S is supported on the lower 2 and the upper carrier elements 3. A movement of the substrate S in a vertical direction designated as V is limited by the counter carrier element 4. In contrast loading and unloading of the device at a slant designated as SR is possible.

To the extent that the counter carrier element 4 is installed detachably on the walls 1, it is also possible to load and unload the substrates S in the vertical direction after the counter carrier element 4 has been removed.

Teeth 5 are provided as retaining means on carrier elements 2, 3. The teeth 5 are positioned here vertically upwards. However it is also possible that the teeth 5 point in the direction of a central axis designated as ZA. The teeth 5 provided on the counter carrier elements 4 point vertically downwards. Also here it is possible that the teeth 5 point in the direction of the central axis ZA. A slit created by two adjacent teeth 5 diminishes in the direction of the carrier element 2, 3 or the carrier element 4.

The circumferential edges around the walls 1 are provided with chamfer edges 6.

The carrier elements 2, 3 each have draining ridges 7a running vertically downwards and the counter carrier element 4 has an additional draining ridge 7b running vertically upwards. A width or height of the draining ridges 71, 7b, increases towards the middle of the carrier elements 2. 3 and/or the counter carrier element 4. Lower edges 8 of the walls 1 have centric a U-shaped first recess 9. The lower edges 8 slope on both sides of the U-shaped first recess 9 downwards to the outside.

Side edges 10 run primarily vertically. This means parallel to the vertical direction V. They have in an upper section second recesses 11 for the use of a gripping device (not shown here) to grip the device.

In addition, a third recess 13 is located on an upper edge 12 of the walls 1. The third recess 13 permits the engagement of a gripping arm for loading and unloading the device with substrates S. At least two of the recess edges 14a, 14b limiting the third recess run aslant to the side edges 10. The thus created slanted third recess 13 permits loading and unloading of the device with substrates S in the slanted direction SR.

Figure 4:
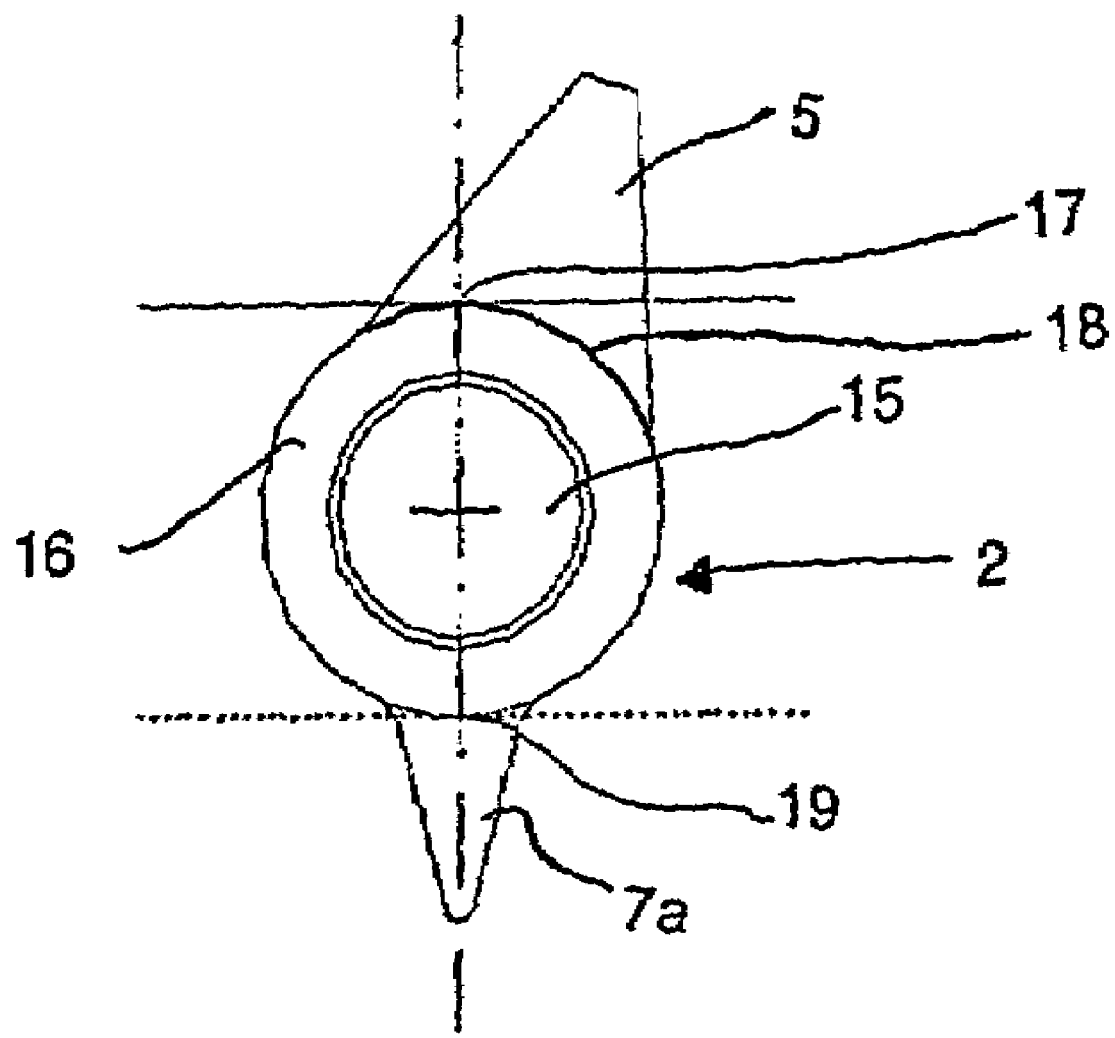

FIG. 4 shows a cross section of a lower carrier element 2. The lower carrier element 2 is formed from a central stiffening structure 15 which is usefully constructed of a second plastic reinforced with carbon fibers. Naturally the stiffening structure can also be made of other materials, wherein non-metallic materials are preferred. The stiffening structure 15 has a coating 16 made of a first plastic. Suitably the first plastic is resistant to acids and bases. This may be, for example, PFA (perfluoroalkoxy polymer), PTFE (polyvinyl-diene-difluoride), PVDF (polytetrafluor ethylene), PP (polypropylene).

Suitably, the teeth 5 and the draining ridges 7a, 7b are made of a one-piece form with the coating 16. An upper apex of the lower carrier element 2 which is formed cylindrically here is designated as 17. A tooth base 18 is in the cross section the circular-segment-shaped contact line here between the tooth 5 and the lower carrier element 2. In order that a complete drainage of cleaning fluid is always ensured, the teeth 5 must be positioned so that the upper apex 17 is part of the tooth base 18.

The shown arrangement of the teeth 5 applies in the same way to the upper-carrier elements 3. It applies similarly to the counter carrier element 4, wherein here a lower apex must be taken for the arrangement of the teeth 5 which is suggested in FIG. 4 with the reference designation 19.

Within the framework of the present invention it is naturally possible to change the number and formation of the carrier elements 2, 3 as well as the counter carrier element 4, in particular to adjust to the geometry of the substrate S to be transported. For instance, it is thus also possible to use only two or one carrier elements/element instead of the four carrier elements described in the present example.

The present invention offers a simple way to prevent an undesired vertical movement of substrates S in a processing bath. At the same time simple loading and unloading of the device is possible without having to remove a holding-down element, such as the counter carrier element 4, from the device.

REFERENCE DESIGNATION LIST

1 Wall
2 Lower carrier element
3 Upper carrier element
4 Counter carrier element
5 Tooth
6 Slanting edge
7a, b Draining ridge
8 Lower edge
9 First recess
10 Side edge
11 Second recess
12 Upper edge
13 Third recess
14a, b Recess edges
15 Stiffening structure
16 Coating
17 Upper apex
18 Tooth base
19 Lower apex
V Vertical direction
SR Slanting direction
S Substrate
E Symmetry plane
ZA Central axis

The invention claimed is:

1. Device for retaining substrates (S), in particular wafers or silicon substrates, for the production of photovoltaic elements with two vis-à-vis walls (1), wherein at least two rod-like carrier elements (2, 3) for connecting the walls (1) are provided, wherein the carrier elements (2, 3) are provided with a retaining means (5) for retaining the substrates (S) supported thereby in a vertical position oriented parallel to the walls (1), wherein at least one rod-like counter carrier element (4) connecting the two walls (1) is provided which is positioned in relation to the carrier elements (2, 3) so that a vertical movement of the substrates (S) relative to the walls (1) is limited thereby and loading or unloading of the substrates (S) is possible at a slant in relation to the vertical direction (V).

2. Device as claimed in claim 1, wherein the counter carrier element (4) is mounted to the walls (1).

3. Device as claimed in claim 1, wherein the substrates (S) can also be loaded or unloaded in the vertical direction (V) when the counter carrier element (4) is removed.

4. Device as claimed in claim 1, wherein at least one of the carrier elements (2, 3) has slit-type recesses or teeth (5) as retaining means.

5. Device as claimed in claim 1, wherein the teeth (5) are mounted on the carrier element (2, 3) so that a tooth base (18) of the teeth (5) is located on the upper apex line (17) of the carrier element (2,3).

6. Device as claimed in claim 1, wherein the counter carrier element (4) has retaining means formed as slit-like recesses or teeth (5) pointing in the direction of the carrier element (2, 3).

7. Device as claimed in claim 1, wherein the teeth (5) are mounted on the counter carrier element (4) so that a tooth base (18) of the teeth (5) is located on the lower apex line (19) of the counter carrier element (4).

8. Device as claimed in claim 1, wherein the counter carrier element (4) is positioned or formed in relation to the carrier element (2, 3) so that the substrates (S) are always retained in the retaining means when a movement in the vertical direction (V) occurs.

9. Device as claimed in claim 1, wherein the carrier element (2, 3) has a draining ridge (7a) which primarily runs vertically downwards.

10. Device as claimed in claim 9, wherein the counter carrier element (4) has an additional draining ridge (7b) which primarily runs vertically upwards.

11. Device as claimed in claim 10, wherein a width of the draining ridge (7a) and/or the additional draining ridge (7b) increases towards the middle of the carrier element (2, 3) or the counter carrier element (4).

12. Device as claimed in claim 1, wherein the edges (8, 10,12) of the walls (1) are slanted.

13. Device as claimed in claim 1, wherein the lower edges (8) of the walls (1) slope downwards from both sides of a centric U-shaped first recess (9).

14. Device as claimed in claim 13, wherein the side edges (10) have second recesses (11) in an upper section in vis-à-vis arrangement for the use of a gripping device.

15. Device as claimed in claim 14, wherein an upper edge (12) of the walls (1) has a third recess (13) for engagement of a loading or unloading device for substrates (S).

16. Device as claimed in claim 15, wherein the third recess (13) is limited by at least two recess edges (14a, 14b) running at a slant to the side edges (10).

17. Device as claimed in claim 1, wherein the carrier element (2, 3) and/or the counter carrier element (4) are formed from a stiffening structure (15) comprising a first plastic.

18. Device as claimed in claim 17, wherein the stiffening structure (15) comprises a structure made of metal, glass, ceramic or a second plastic reinforced with fibers, which is coated with the first plastic.

19. Device as claimed in claim 17, wherein the walls (1) are made from the first plastic.

20. Device as claimed in claim 17, wherein the first plastic is a plastic which is resistant to acids and bases and which is selected from the group consisting of: PFA, PTFE and PVDF.

21. Device as claimed in claim 19, wherein the first plastic is reinforced with fibers.

22. Device as claimed in claim 1, wherein four carrier elements (2, 3) connect the walls (1).

23. Device as claimed in claim 1, wherein two lower carrier elements (2) are mounted in the vicinity of a lower edge (8) of the walls (1) and two upper carrier elements (3) are mounted in the vicinity of a lower section of the side edges (10) of the walls (1).

24. Device as claimed in claim 1, wherein the counter carrier element (4) is mounted in the vicinity of an upper edge (12) of the walls (1).

25. Device as claimed in claim 1, wherein the counter carrier element (4) is mounted staggered in relation to a symmetry plane (F) that relates to the arrangement or the formation of the carrier element/carrier elements (2, 3) and runs parallel to the carrier element/carrier elements (2, 3).

26. Device as claimed in claim 1, wherein the substrates (S) being retained are rectangular.

* * * * *

UNITED STATES PATENT AND TRADEMARK OFFICE
CERTIFICATE OF CORRECTION

| | | |
|---|---|---|
| PATENT NO. | : 7,270,240 B2 | |
| APPLICATION NO. | : 10/493789 | |
| DATED | : September 18, 2007 | |
| INVENTOR(S) | : Niese et al. | |

It is certified that error appears in the above-identified patent and that said Letters Patent is hereby corrected as shown below:

Column 8, Line 13 (Claim 25, Line 3), after 'plane', delete "(F)" and insert --(E)--.

Signed and Sealed this

Thirteenth Day of May, 2008

JON W. DUDAS
*Director of the United States Patent and Trademark Office*